United States Patent
Kim

(10) Patent No.: US 7,821,851 B2
(45) Date of Patent: Oct. 26, 2010

(54) SEMICONDUCTOR MEMORY DEVICE CAPABLE OF OPERATING IN A PLURALITY OF OPERATING MODES AND METHOD FOR CONTROLLING THEREOF

(75) Inventor: Jae-hoon Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 304 days.

(21) Appl. No.: 12/078,423

(22) Filed: Mar. 31, 2008

(65) Prior Publication Data

US 2008/0316843 A1 Dec. 25, 2008

(30) Foreign Application Priority Data

Jun. 19, 2007 (KR) .................. 10-2007-0060049

(51) Int. Cl.
*G11C 7/00* (2006.01)

(52) U.S. Cl. ............. 365/191; 365/185.05; 365/189.03; 365/227

(58) Field of Classification Search .......... 365/191, 365/185.05, 189.03, 227
See application file for complete search history.

(56) References Cited

U.S. PATENT DOCUMENTS

| | | | | |
|---|---|---|---|---|
| 5,781,485 A | * | 7/1998 | Lee et al. | 365/201 |
| 7,046,563 B1 | * | 5/2006 | Kim | 365/201 |
| 7,420,831 B2 | * | 9/2008 | Seo et al. | 365/63 |
| 2008/0056023 A1 | * | 3/2008 | Lee et al. | 365/189.011 |
| 2008/0080288 A1 | * | 4/2008 | Park et al. | 365/226 |
| 2008/0094890 A1 | * | 4/2008 | Kim et al. | 365/185.2 |
| 2008/0137461 A1 | * | 6/2008 | Pyeon et al. | 365/219 |
| 2009/0185442 A1 | * | 7/2009 | Pyeon et al. | 365/220 |

FOREIGN PATENT DOCUMENTS

| | | |
|---|---|---|
| JP | 2006-059046 | 3/2006 |
| JP | 2006-215854 | 8/2006 |
| KR | 10-2004-0006105 | 1/2004 |
| KR | 1020070014432 | 2/2007 |

OTHER PUBLICATIONS

Korean Patent Office Action dated Jun. 26, 2008.

* cited by examiner

*Primary Examiner*—Tuan T. Nguyen
(74) *Attorney, Agent, or Firm*—Harness, Dickey & Pierce, P.L.C.

(57) ABSTRACT

A semiconductor memory device capable of operating in a plurality operating modes and a method for controlling the device may be provided. The semiconductor memory device may include a selecting unit and a plurality of control circuits operating in a plurality of operating modes. The selecting unit may transmit a selecting signal to select one of the plurality of operating modes. The plurality of control circuits may control operations of the semiconductor memory device in the plurality of operating modes, and the plurality of control circuits may be either enabled or disabled in response to the selecting signal. The semiconductor memory device and the method of controlling the device may have a capability of providing optimized performance in response to a change of operational conditions by selecting one of a plurality of the operating modes.

19 Claims, 4 Drawing Sheets

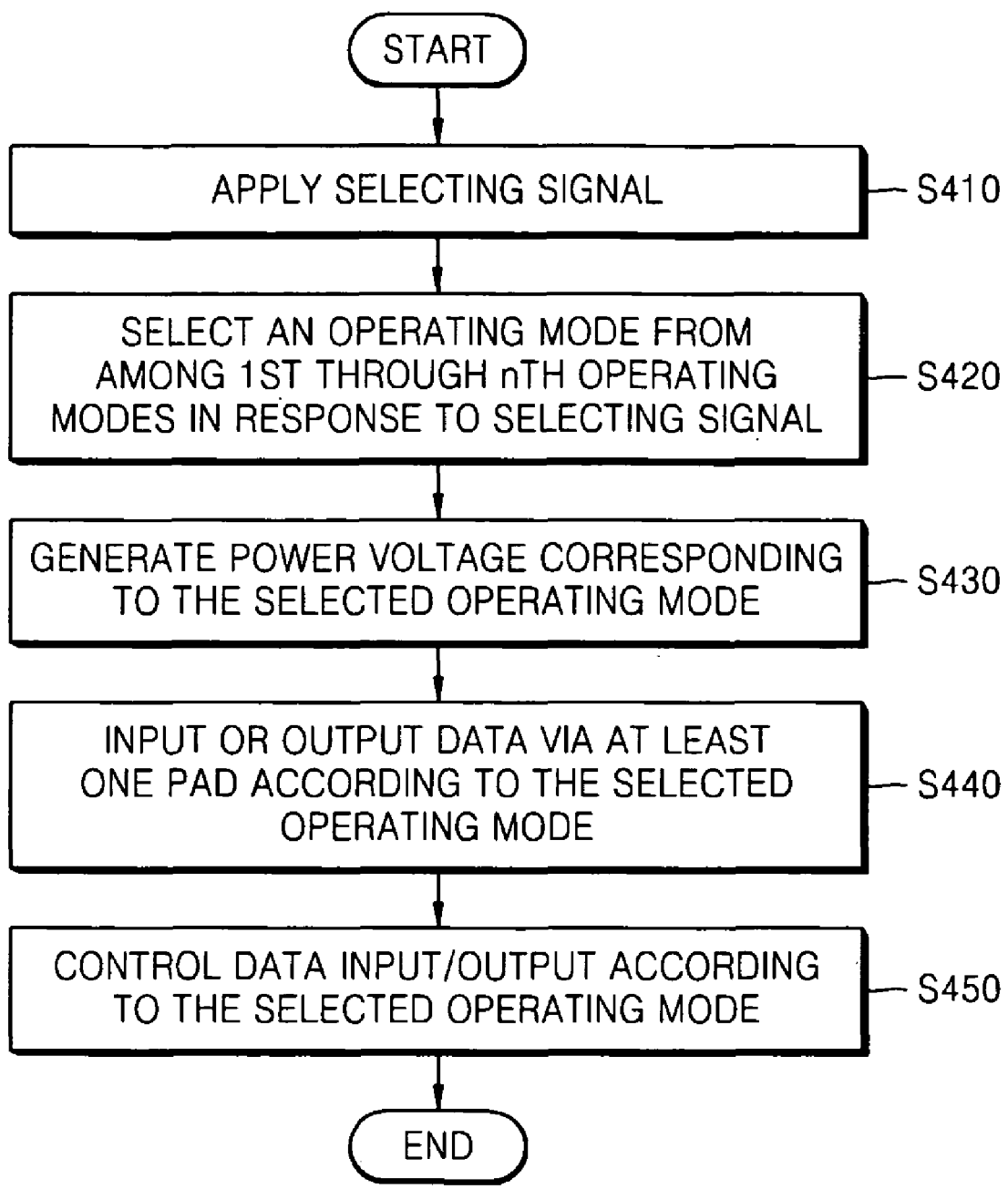

SEMICONDUCTOR MEMORY DEVICE CAPABLE OF OPERATING IN A PLURALITY OF OPERATING MODES AND METHOD FOR CONTROLLING THEREOF

PRIORITY STATEMENT

This application claims the benefit of Korean Patent Application No. 10-2007-0060049, filed on Jun. 19, 2007, in the Korean Intellectual Property Office, the disclosure of which is incorporated herein in its entirety by reference.

BACKGROUND

Currently available semiconductor memory device products may roughly be divided into two types: stationary products receiving unlimited power from a power supply, and portable products relying on pre-supplied power. Since the stationary products may have unlimited power from a power supply, improving efficiency may be more important than lowering power consumption. In contrast, lowering power consumption may be more important for portable products, since the portable products generally rely on batteries, which usually have a limited power supply. That is, although both the portable and the stationary products may pursue higher efficiency, larger integration, and lower power consumption, the development of portable products may be more focused on lowering power consumption while the development of stationary products may be more focused on improving efficiency.

For example, a stationary semiconductor memory device may use a double data rate 3 (DDR3) dynamic random access memory (DRAM), while a portable semiconductor memory device may use a mobile double data rate (MDDR) DRAM. In this case, it may be more difficult to lower power consumption of the stationary device using the DDR3 DRAM than that of the portable device using the MDDR DRAM, even if the stationary device is imparted with mobility. On the other hand, it may be more difficult to improve efficiency of the portable device using the MDDR DRAM than that of the stationary device using the DDR3 DRAM, even if unlimited power is supplied in a manner similar to the stationary device.

In this regard, it may be necessary for the stationary device to lower power consumption in the manner of the mobile device, and for the portable device to operate with higher efficiency while receiving unlimited power from a power supply in the manner of the stationary device.

SUMMARY

Example embodiments may provide a semiconductor memory device selecting one of a plurality of operating modes to provide optimized performance for a current operating condition.

Example embodiments may also provide a method for controlling the semiconductor memory device.

According to example embodiments, a semiconductor memory device may include a plurality of mode control circuits controlling operations of the semiconductor memory device in a plurality of operating modes.

The semiconductor device may further include a selecting unit transmitting a selecting signal to select one of the plurality of operating modes. The plurality of mode control circuits may be one of enabled and disabled in response to the selecting signal.

The semiconductor device may further include a common control circuit may be enabled if one of the plurality of mode control circuits is enabled. The enabled common control circuit may control the semiconductor memory device concurrently with one of the enabled mode control circuits.

The semiconductor device may further include a power voltage generating unit may generating a plurality of power voltages corresponding to the plurality of operating modes. The power voltage generating unit may generate one of the plurality of power voltages in response to the selection signal.

The plurality of mode control circuits control data may input/output in the plurality of operating modes.

One of the plurality of mode control circuits may be enabled in response to the selecting signal, and the remaining plurality of mode control circuits may be disabled in response to the selecting signal.

The semiconductor memory device may further include at least one pad inputting or outputting data in one of the plurality of operating modes.

According to example embodiments, the semiconductor memory device may further include a plurality of pad groups inputting or outputting data in the plurality of operating modes in response to the selecting signal. Each pad group may include the at least one pad.

At least one of the plurality of pad groups may share at least one pad with at least one of the other plurality of pad groups.

According to example embodiments, the semiconductor memory device may further include a pad group inputting or outputting data in the plurality of operating modes. The pad group may include the at least one pad.

The pad groups may not share the at least one pad with other pad groups.

The semiconductor memory device may further include at least one memory cell array including cells. The cells may store data.

According to example embodiments, a method for controlling a semiconductor memory device to operate in a plurality of operating modes may include applying a selecting signal to select one of the plurality of operating modes, selecting one of the plurality of operating modes in response to the selecting signal, and/or controlling the semiconductor memory device to operate in the selected operating mode.

BRIEF DESCRIPTION

The above and other features and advantages will become more apparent by describing in detail example embodiments with reference to the attached drawings in which:

FIG. 4 is a flow chart of a method for controlling a semiconductor memory device according to example embodiments.

DETAILED DESCRIPTION

Figure 1:
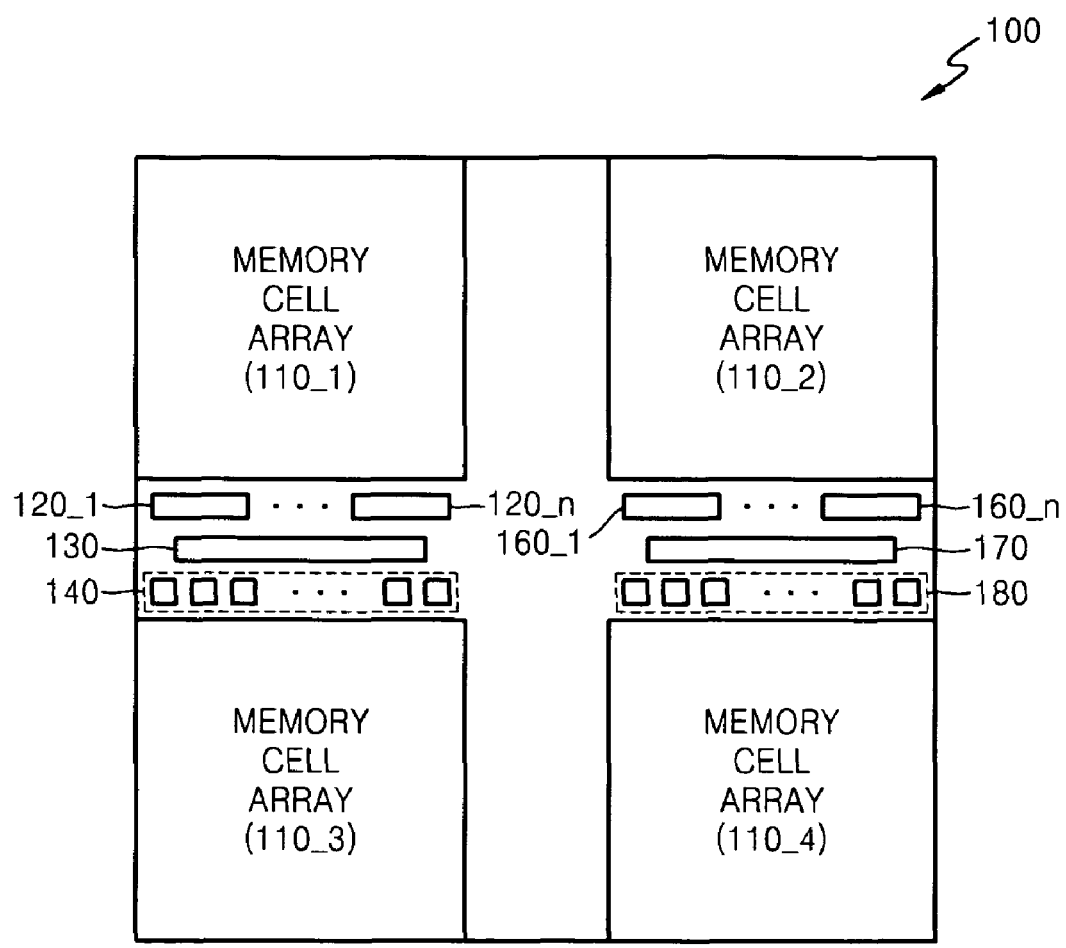
FIG. 1 is a block diagram of a semiconductor memory device according to example embodiments.

Example embodiments will now be described more fully with reference to the accompanying drawings.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved. In the following description, the same reference numerals denote the same elements.

Although the example embodiments have been disclosed for illustrative purposes, those skilled in the art will appreciate that various modifications, additions and substitutions are possible, without departing from the scope and spirit of example embodiments as disclosed in the accompanying claims.

FIG. 1 is a block diagram of a semiconductor memory device 100 according to example embodiments.

Referring to FIG. 1, the semiconductor memory device 100 may have at least one cell array 110_1, 110_2, 110_3, and 110_4, $1^{st}$ through $n^{th}$ control circuits 120_1 through 120_n and 160_1 through 160_n, common control circuits 130 and 170, and at least one pad 140 and 180.

Each of the memory cell arrays 110_1, 110_2, 110_3, and 110_4 may include cells in which data is stored. While the four memory cell arrays 110_1, 110_2, 110_3, and 110_4 are shown in FIG. 1, the same effect may be obtained where a different number of the cell arrays are included. For the sake of clarity, only memory cell array 110_1 only will be described hereinafter.

The $1^{st}$ through $n^{th}$ control circuits 120_1 through 120_n may be capable of controlling operations of the semiconductor memory device (data input/output) in the $1^{st}$ through $n^{th}$ operating modes, respectively. For example, the semiconductor memory device 100 may operate in the $1^{st}$ operating mode if the $1^{st}$ control circuit 120_1 is enabled, and the semiconductor memory device may operate in a $k^{th}$ operating mode (where k is a natural number greater than one and less than n) if the $k^{th}$ control circuit is enabled. The $1^{st}$ through $n^{th}$ control circuits 120_1 through 120_n may be capable of controlling data input/output in the $1^{st}$ through $n^{th}$ operating modes, respectively. For example, if the semiconductor memory device 100 performs either a reading operation or a writing operation, the $1^{st}$ through $n^{th}$ control circuits 120_1 through 120_n may transmit data through the memory cell array and the pad in the $1^{st}$ through $n^{th}$ operating modes, respectively. Each of the control circuits 120_1 through 120_n may include a sense amplifier and a buffer. A definition of the operating mode may be an operating mode capable of exhibiting optimized performance in various operational conditions of a product. For example, the $1^{st}$ operating mode may represent an operating mode of a double data rate 3 (DDR3) dynamic random access memory (DRAM) operating in high efficiency, while the $2^{nd}$ operating mode may represent an operating mode of a mobile double data rate (MDDR) DRAM consuming less power. That is, semiconductor memory devices with identical memory cell structures may be integrated into a single semiconductor memory device while retaining their own modes. For example, DRAM type semiconductor memory devices, in which a cell may include one transistor and one capacitor, may be embodied as a single semiconductor memory device as shown in example embodiments.

If any one of the $1^{st}$ through $n^{th}$ control circuits 120_1 through 120_n is enabled, the remaining control circuits, that is, the $1^{st}$ through $n^{th}$ control circuits 120_1 through 120_n except the enabled control circuit may be disabled. The reason is that the semiconductor memory device 100 may operate in only one of the operating modes at any one time. For example, the semiconductor memory device 100 may include the operating mode of the DDR3 DRAM and the operating mode of the MDDR DRAM. The semiconductor memory device 100 may be controlled to operate in the operating mode of the DDR3 DRAM if the semiconductor memory device is used in a manner in which the stationary device is used, and may be controlled to operate in the operating mode of the MDDR DRAM if the semiconductor memory device is used in a manner in which the mobile device is used.

If any one of the $1^{st}$ through $n^{th}$ control circuits 120_1 through 120_n is enabled, the common control circuit 130 may be enabled to control operations of the semiconductor memory device 100 concurrently with the enabled control circuit. That is, the common control circuit 130 may be a control circuit operational in all operating modes. For example, if the semiconductor memory device has the operating mode of the DDR3 DRAM and the operating mode of the MDDR DRAM, the common control circuit 130 may operate not only when the semiconductor memory device operates in the operating mode of the DDR3 DRAM, but also may operate when the semiconductor memory device operates in the operating mode of the MDDR DRAM.

The semiconductor memory device 100 may utilize at least one pad 140 to input or output the data. If utilizing a plurality of pads 140 is advantageous, extra pads may be required depending on operating modes. Such a case is shown in more detail in FIG. 2.

Figure 2:
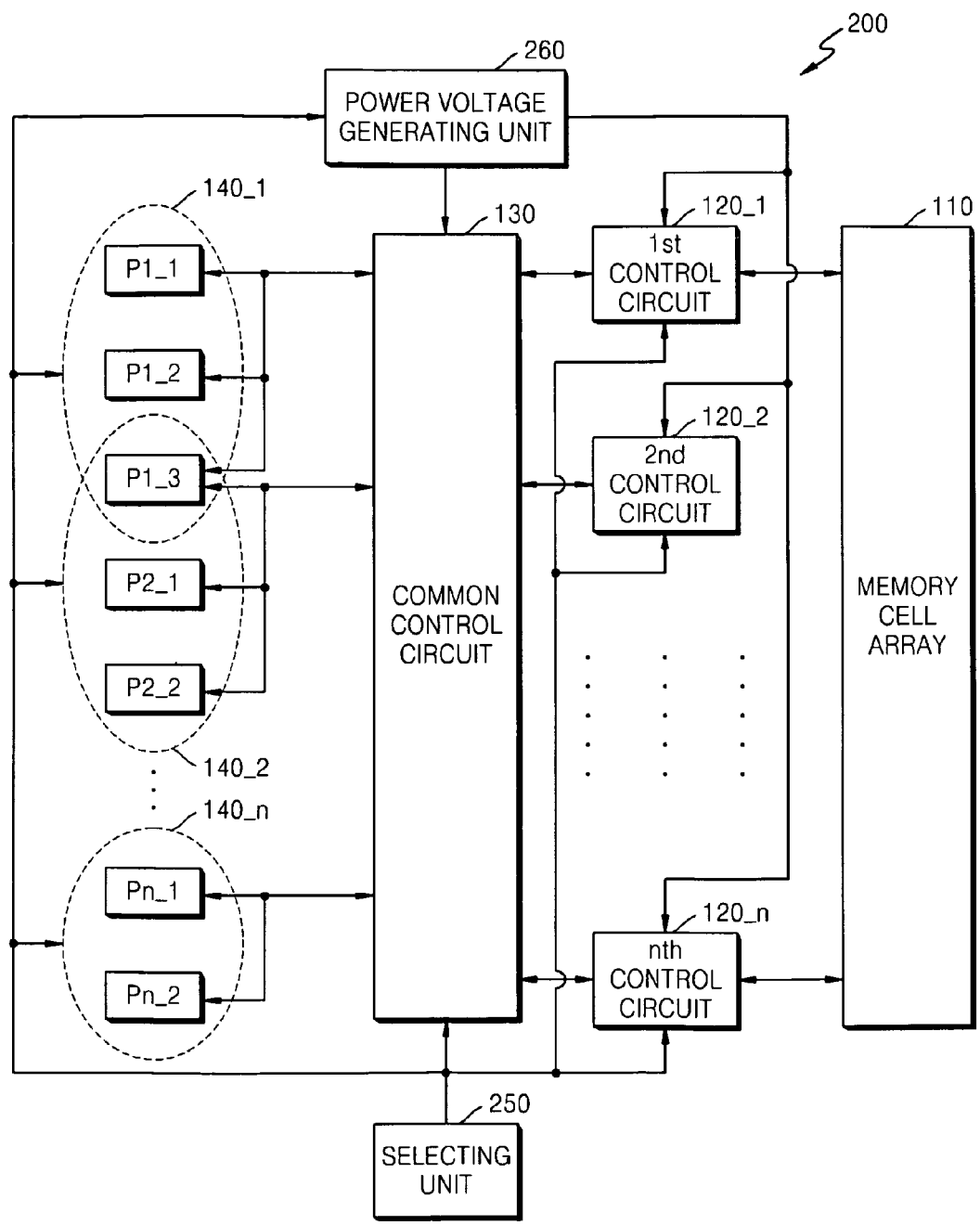
FIG. 2 is another block diagram of a semiconductor memory device according to example embodiments.

FIG. 2 is another block diagram of a semiconductor memory device according to example embodiments.

Referring to FIG. 2, a semiconductor memory device 200 may include a memory cell array 110, $1^{st}$ through $n^{th}$ control circuits 120_1 through 120_n, a common control circuit 130, $1^{st}$ through $n^{th}$ pad groups 140_1 through 140_n, a selecting unit 250, and a power voltage generating unit 260.

While a semiconductor device having only one memory cell array is shown in FIG. 2, the same effect may be obtained from a semiconductor memory device having a plurality of memory cell arrays similar to the same memory cell array configuration shown in FIG. 2.

The selecting unit 250 may transmit a selecting signal to select one of the $1^{st}$ through $n^{th}$ operating modes. The selecting unit 250 may transmit the selecting signal to the $1^{st}$ through $n^{th}$ control circuits 120_1 through 120_n, the common control circuit 130, and the $1^{st}$ through $n^{th}$ pad groups 140_1 through 140_n. The selecting signal may be transmitted to one or more of the pads P1_1 through Pn_2 within the $1^{st}$ through $n^{th}$ pad groups 140_1 through 140_n. The $1^{st}$ through $n^{th}$ control circuits 120_1 through 120_n may be either enabled or disabled in response to the selecting signal. Also, the $1^{st}$ through $n^{th}$ pad groups 140_1 through 140_n may either input/output data or not input/output data in response to the selecting signal.

The $1^{st}$ through $n^{th}$ pad groups 140_1 through 140_n may input or output data in the $1^{st}$ through $n^{th}$ operating modes, respectively, in response to the selecting signal. For example, if the $1^{st}$ pad group 140_1 is enabled, the semiconductor memory device 200 may input or output data via pads P1_1, P1_2, and P1_3 included in the $1^{st}$ pad group 140_1 in the $1^{st}$ operating mode. If the $k^{th}$ pad group (where k is a natural number greater than one and less than n) is enabled, the semiconductor memory device 200 may input or output data via pads included in the $k^{th}$ pad group 140_k in the $k^{th}$ operating mode. Since each of the operating modes may utilize different pads to input or output data, the semiconductor memory device 200 may utilize pad groups corresponding to the operating modes.

Figure 3:
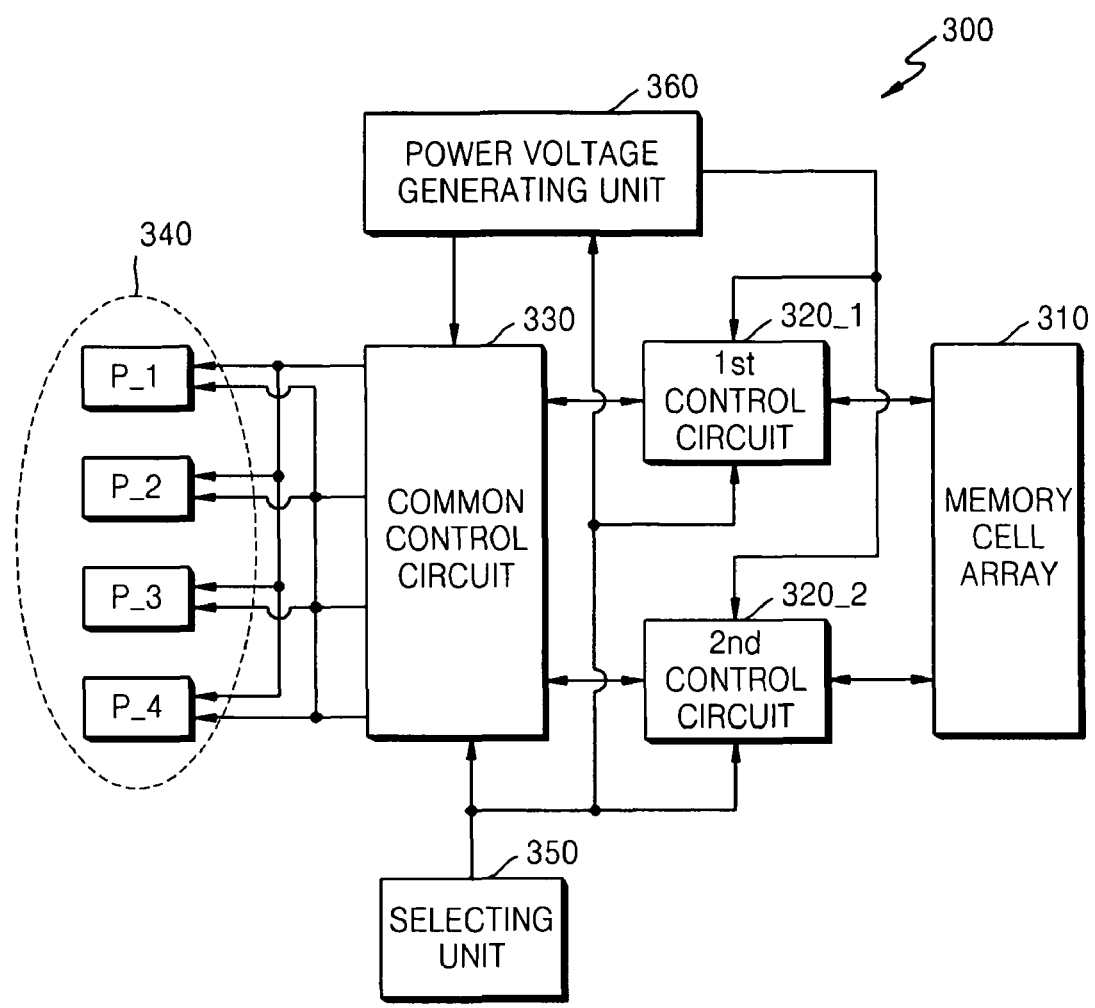
FIG. 3 is another block diagram of a semiconductor memory device according to example embodiments.

At least one of the $1^{st}$ through $n^{th}$ pad groups may share at least one pad with other pad groups. Referring to FIG. 2, the $1^{st}$ pad group 140_1 and the $2^{nd}$ pad group 140_2 may share a common pad P1_3. That is, if the semiconductor memory device 200 operates in the $1^{st}$ operating mode, the semiconductor memory device 200 may input or output data via pads P1_1, P1_2, and P1_3 of the $1^{st}$ pad group 140_1. Meanwhile, if the semiconductor memory device 200 operates in the $2^{nd}$ operating mode, the semiconductor memory device 200 may input or output data via pads P1_3, P2_1, and P2_2 of the $2^{nd}$ pad group 140_2. That is, the semiconductor memory device may input or output data via the common pad P1_3 not only when the semiconductor memory device operates in the $1^{st}$ operating mode, but may also input or output data via the common pad P1_3 when the semiconductor memory device operates in the $2^{nd}$ operating mode. The $n^{th}$ pad group 140_n may represent a pad group having no common pads. A case where a pad group includes only common pads, which may not exclusively correspond to any of the operating modes, is shown in FIG. 3.

The power voltage generating unit 260 may generate $1^{st}$ through $n^{th}$ power voltages corresponding to the $1^{st}$ through $n^{th}$ operating modes, respectively. That is, the power voltage generating unit 260 may generate one of the $1^{st}$ through $n^{th}$ power voltages in response to the selecting signal. If the semiconductor memory device operates in the $1^{st}$ operating mode, the power voltage generating unit 260 may generate the $1^{st}$ power voltage. In the same manner, if the semiconductor memory device operates in the $2^{nd}$ operating mode, the power voltage generating unit 260 may generate the $2^{nd}$ power voltage.

For example, a case where the semiconductor memory device 200 operates in the $1^{st}$ operating mode may be described hereinafter. The selecting unit 250 may transmit the selecting signal to the $1^{st}$ through $n^{th}$ control circuits 120_1 through 120_n, the common control circuit 130, the $1^{st}$ through $n^{th}$ pad groups 140_1 through 140_n, and the power voltage generating unit 260. In response to the selecting signal, the $1^{st}$ control circuit 120_1 and the common control circuit 130 may be enabled, data may be input or output via the pads P1_1, P1_2, and P1_3 of the $1^{st}$ pad group 140_1, and the power voltage generating unit 260 may generate the $1^{st}$ power voltage. The power voltage generating unit 260 may supply the $1^{st}$ power voltage to the $1^{st}$ control circuit 120_1 and the common control circuit 130. The $2^{nd}$ to the $n^{th}$ control circuits 120_2 through 120_n may be disabled in response to the selecting signal. The $2^{nd}$ to the $n^{th}$ pad groups 140_2 through 140_n may also be disabled in response to the selecting signal. Therefore, the semiconductor memory device 200 may operate in the $1^{st}$ operating mode. That is, the semiconductor memory device 200 may either write data to the memory cell array 110 or read data from the memory cell array 110 via the $1^{st}$ control circuit 120_1, the common control circuit 130, and the pads P1_1, P1_2, and P1_3 of the $1^{st}$ pad group 140_1.

If it becomes necessary for the semiconductor memory device operating in the $1^{st}$ operating mode to operate in the $n^{th}$ operating mode due to a change of operational conditions, the semiconductor memory unit 200 may be controlled to operate in the $n^{th}$ operating mode instead. While not shown in FIG. 2, if a command is applied to the semiconductor memory device to operate in the $n^{th}$ operating mode, a CPU (not shown) may apply the command to the selecting unit 250. The selecting unit 250 may transmit a new selecting signal to the $1^{st}$ through $n^{th}$ control circuits 120_1 through 120_n, the common control circuit 130, the $1^{st}$ through $n^{th}$ pad groups 140_1 through 140_n, and the power voltage generating unit 260. In response to the new selecting signal, the $n^{th}$ control circuit 120_n and the common control circuit 130 may be enabled, data may be input or output via the pads Pn_1 and Pn_2 of the $n^{th}$ pad group 140_n, and the power voltage generating unit 260 may generate the $n^{th}$ power voltage. The power voltage generating unit 260 may supply the $n^{th}$ power voltage to the $n^{th}$ control circuit 120_n and the common control circuit 130. The $1^{st}$ to the $n-1^{th}$ control circuits 120_1 through 120_n-1 may be disabled in response to the selecting signal. The $1^{st}$ to the $n-1^{th}$ pad groups 140_1 through 140_n-1 may also be disabled in response to the selecting signal. Therefore, the semiconductor memory device 200 may operate in the $n^{th}$ operating mode.

FIG. 3 is another block diagram of a semiconductor memory device according to example embodiments.

FIG. 3 shows a semiconductor memory device 300 including a memory cell array 310, two control circuits 320_1 and 320_2, a common control circuit 330, a single pad group 340, a selecting unit 350 and a power voltage generating unit 360. The single pad group 340 may include common pads P_1, P_2, P_3, and P_4. That is, the semiconductor memory device may input or output data via the pads P_1, P_2, P_3, and P_4 not only when the semiconductor memory device is in the $1^{st}$ operating mode, but may also input or output data via the pads P_1, P_2, P_3, and P_4 when the semiconductor memory device operates in the $2^{nd}$ operating mode.

Hereinafter, the $1^{st}$ operating mode may be an operating mode of the DDR3 DRAM, while the $2^{nd}$ operating mode may be an operating mode of the MDDR DRAM.

For example, if a device including the semiconductor memory device 300 is a stationary device, it may be more efficient to operate in a high efficiency mode than to operate in a low power consumption mode. In this regard, if the device including the semiconductor memory device 300 is stationary, the semiconductor memory device 300 may operate in the $1^{st}$ operating mode. Therefore, a selecting unit 350 may transmit a selecting signal selecting the $1^{st}$ operating mode, and the $1^{st}$ control circuit 320_1 and a common control circuit 330 may be enabled in response to the selecting signal. A power voltage generating unit 360 may also supply the 1$^{st}$ power voltage to the common control circuit 330 and the 1$^{st}$ control circuit 320_1 in response to the selecting signal. The 2$^{nd}$ control circuit 320_2 may be disabled in response to the selecting signal. Since the pads P_1, P_2, P_3, and P_4 may input or output data regardless of the operating mode, they may not require the selecting signal to enable them to input or output data in a particular operating mode. However, if the pad group was divided into 1$^{st}$ pad group corresponding to the 1$^{st}$ operating mode and a 2$^{nd}$ pad group corresponding to the 2$^{nd}$ operating mode as in FIG. 2, data may be input or output only via the 1$^{st}$ pad group when the semiconductor memory device 300 operates in the 1$^{st}$ operating mode. Therefore, the semiconductor memory device may only input or output data via the 1$^{st}$ pad group in response to the selecting signal in such a case.

In a case where the device including the semiconductor memory device 300 is to be used as a portable device, it may be more efficient to operate in the low power consumption mode than to operate in the high efficiency mode. In this regard, if a device including the semiconductor memory device 300 is mobile, the semiconductor memory device 300 may operate in the 2$^{nd}$ operating mode. That is, the selecting unit 350 may transmit a new selecting signal to select the 2$^{nd}$ operating mode, and then the 2$^{nd}$ control circuit 320_2 and the common control circuit 330 may be enabled in response to the selecting signal. The power voltage generating unit 360 may also supply the 2$^{nd}$ power voltage to the common control circuit 330 and the 2$^{nd}$ control circuit 320_2 in response to the new selecting signal. The 1$^{st}$ control circuit 320_1 may be disabled in response to the selecting signal. The pads P_1, P_2, P_3, and P_4 may input or output data regardless of the new selecting signal.

As described hereinbefore, the semiconductor memory device 300 according to example embodiments may be capable of operating in different operating modes if a specific operating mode is needed. In this regard, it may be possible for the semiconductor memory device to operate in an optimized manner in various operational conditions.

FIG. 4 is a flow chart of a method for controlling a semiconductor memory device according to example embodiments.

Referring to FIG. 2 and FIG. 4, the selecting unit 250 may transmit a selecting signal to select one of the 1$^{st}$ through n$^{th}$ operating modes (operation S410). In response to the selecting signal, one of the 1$^{st}$ through n$^{th}$ operating modes may be selected (operation S420). For example, a selecting signal from the selecting unit 250 may be a signal selecting a k$^{th}$ operating mode (where k is a natural number greater than one and less than n). The power voltage generating unit 260 may generate a k$^{th}$ power voltage in response to the selecting signal (operation S430). The power voltage generating unit 260 may supply the k$^{th}$ power voltage to a k$^{th}$ control circuit 120_k and the common control circuit 130. In response to the selecting signal, a k$^{th}$ pad group 140_k from among the 1$^{st}$ through n$^{th}$ pad groups 140_1 through 140_n may be selected. Therefore, the semiconductor memory device 200 may input or output data via pads of the k$^{th}$ pad group 140_k corresponding to the k$^{th}$ operating mode (operation S440). In response to the selecting signal, the k$^{th}$ control circuit 120_k may also be enabled, and the remaining control circuits 120_1 through 120_k−1 and 120_k+1 through 120_n may be disabled. Therefore, the semiconductor memory device 200 may utilize the k$^{th}$ control circuit 120_k to control data input/output in the k$^{th}$ operating mode (operation S450).

In FIG. 4, a case where a semiconductor memory device operates in a sequence of initially generating power voltage in response to a selecting signal, then inputting or outputting data via corresponding pads, and finally controlling data input or output is shown. However, the same effect may be obtained even if the sequence is altered, according to example embodiments.

The semiconductor memory device and the method for controlling the device according to example embodiments may provide optimized performances in response to a change of operational conditions of the semiconductor memory device by selecting one operating mode from a plurality of the operating modes and by operating in the selected operating mode. For example, a device including the semiconductor memory device may be capable of providing a high efficiency mode when operated as a stationary device, while the semiconductor memory device may also be capable of providing a low power consumption mode when operated as a portable device.

While example embodiments have been shown and described with reference to FIGS. 1-4, it will be understood by those of ordinary skill in the art that various changes in form and details may be made therein without departing from the spirit and scope of example embodiments as defined by the following claims.

What is claimed is:

1. A semiconductor memory device comprising:
   a plurality of mode control circuits controlling operations of the semiconductor memory device in a plurality of operating modes; and
   a selecting unit transmitting a selecting signal to select one of the plurality of operating modes, wherein
   the plurality of mode control circuits are one of enabled and disabled in response to the selecting signal.

2. The semiconductor memory device of claim 1,
   further comprising:
   a common control circuit enabled if one of the plurality of mode control circuits is enabled, the enabled common control circuit controlling the semiconductor memory device concurrently with one of the enabled mode control circuits.

3. The semiconductor memory device of claim 1, further comprising:
   a power voltage generating unit generating a plurality of power voltages corresponding to the plurality of operating modes,
   wherein the power voltage generating unit generates one of the plurality of power voltages in response to the selection signal.

4. The semiconductor memory device of claim 1, wherein the plurality of mode control circuits control data input/output in the plurality of operating modes.

5. The semiconductor memory device of claim 1, wherein,
   one of the plurality of mode control circuits is enabled in response to the selecting signal, and
   the remaining plurality of mode control circuits are disabled in response to the selecting signal.

6. The semiconductor memory device of claim 1, further comprising:
   at least one pad inputting or outputting data in one of the plurality of operating modes.

7. The semiconductor memory device of claim 6, further comprising:
   a plurality of pad groups inputting or outputting data in the plurality of operating modes in response to the selecting signal, each pad group including the at least one pad.

8. The semiconductor memory device of claim 7, wherein the at least one of the plurality of pad groups shares at least one pad with at least one of the other plurality of pad groups.

9. The semiconductor memory device of claim 6, further comprising:
   a pad group inputting or outputting data in the plurality of operating modes, the pad group including the at least one pad.

10. The semiconductor memory device of claim 9, wherein the pad group does not share the at least one pad with other pad groups.

11. The semiconductor memory device of claim 1, further comprising:
   at least one memory cell array including cells, the cells storing data.

12. A method for controlling a semiconductor memory device to operate in a plurality of operating modes, comprising:
   applying a selecting signal to select one of the plurality of operating modes;
   selecting one of the plurality of operating modes in response to the selecting signal; and
   controlling the semiconductor memory device to operate in the selected operating mode.

13. The method of claim 12, further comprising:
   inputting or outputting data via at least one pad in the selected operating mode.

14. The method of claim 12, further comprising:
   generating a power voltage corresponding to the selected operating mode.

15. The method of claim 14, wherein the generating includes the power voltage generated being one of a plurality of power voltages capable of being generated in response to the selection signal.

16. The method of claim 14, wherein the controlling the semiconductor memory device includes controlling the semiconductor memory device to operate by utilizing the power voltage.

17. The method of claim 12, wherein the selecting includes the selected mode being enabled in response to the selecting signal, and the remaining plurality of modes being disabled in response to the selecting signal.

18. The method of claim 12, wherein in the controlling the semiconductor memory device, data input/output is controlled according to the selected operating mode.

19. The method of claim 12, wherein the controlling includes controlling the semiconductor memory device being controlled concurrently during the selected operating mode.

* * * * *